(12) United States Patent
Huang et al.

(10) Patent No.: US 10,170,571 B1
(45) Date of Patent: Jan. 1, 2019

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Chi-Feng Huang, Hsinchu County (TW); Chia-Chung Chen, Keelung (TW); Victor Chiang Liang, Hsinchu (TW); Meng-Chang Ho, Taichung (TW); Chung-Hao Chu, Hsinchu (TW); Tz-Hau Guo, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/638,390

(22) Filed: Jun. 30, 2017

(51) Int. Cl.
*H01L 29/78* (2006.01)
*H01L 29/423* (2006.01)
*H01L 27/088* (2006.01)
*H01L 21/8234* (2006.01)

(52) U.S. Cl.
CPC ............ *H01L 29/42324* (2013.01); *H01L 21/823437* (2013.01); *H01L 27/088* (2013.01); *H01L 29/78* (2013.01)

(58) Field of Classification Search
CPC ............ H01L 27/088; H01L 29/78; H01L 21/823437; H01L 29/42324
USPC .................................................. 257/368
See application file for complete search history.

(56) References Cited

U.S. PATENT DOCUMENTS

2016/0079383 A1* 3/2016 Huang ............... H01L 29/4966
257/407

* cited by examiner

*Primary Examiner* — Fernando L Toledo
*Assistant Examiner* — Adam S Bowen
(74) *Attorney, Agent, or Firm* — JCIPRNET

(57) ABSTRACT

A semiconductor device includes a composite gate structure formed over a semiconductor substrate. The composite gate structure includes a gate dielectric layer, a metal feature, and a semiconductor feature. The metal feature is disposed on the gate dielectric layer. The semiconductor feature is disposed on the gate dielectric layer. The metal feature and the semiconductor feature are stacked on the gate dielectric layer side by side.

20 Claims, 12 Drawing Sheets

SEMICONDUCTOR DEVICE AND MANUFACTURING METHOD THEREOF

BACKGROUND

The semiconductor integrated circuit (IC) industry has experienced rapid growth. Over the course of this growth, functional density of the devices has generally increased by the device feature size.

This scaling down process generally provides benefits by increasing production efficiency, lower costs, and/or improving performance. Such scaling down has also increased the complexities of processing and manufacturing ICs and, for these advances to be realized similar developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
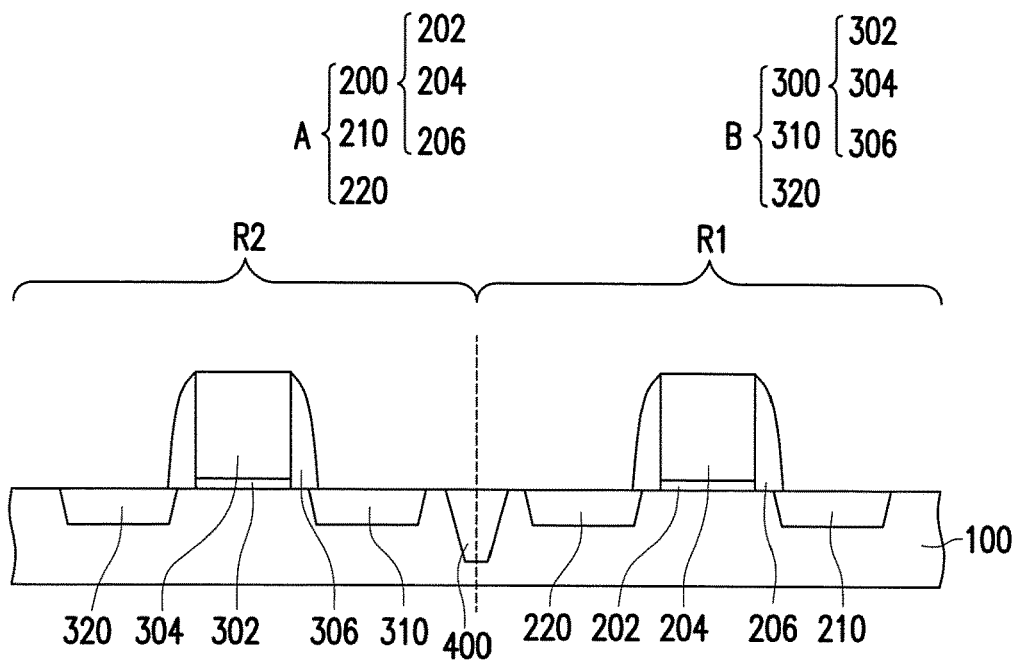
FIGS. 1A-1M are schematic cross-sectional views illustrating a process flow for manufacturing a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1M are schematic cross-sectional views illustrating a process flow for manufacturing a semiconductor device 10 in accordance with some embodiments of the disclosure. FIG. 2 is a schematic top view of a first composite gate electrode 204a in FIG. 1H.

Figure 2:
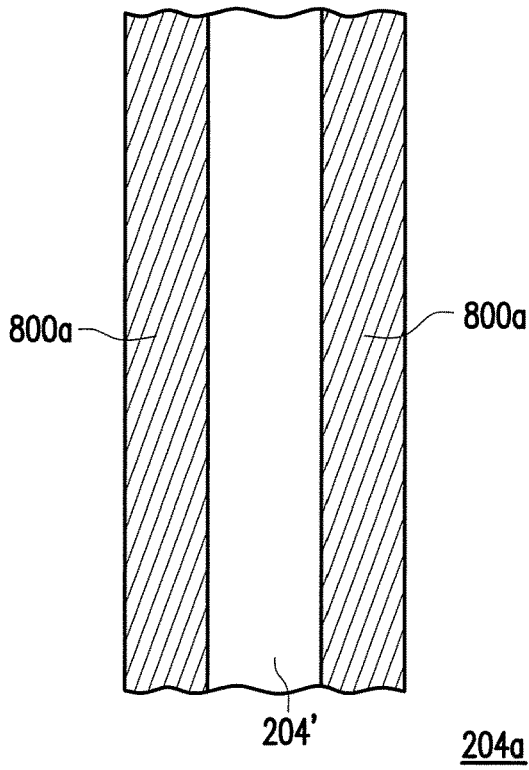
FIG. 2 is a schematic top view of a first composite gate electrode in FIG. 1H.

Referring to FIG. 1A, a substrate 100 is provided. The substrate 100 is divided into a first region R1 and a second region R2. A first intermediate metal-oxide-semiconductor (MOS) device A is formed in the first region R1 and a second intermediate MOS device B is formed in the second region R2. The substrate 100 is a planar substrate or a bulk substrate. An exemplary material of the substrate 100 includes silicon, an alloy semiconductor such as silicon germanium, silicon germanium carbide, gallium arsenic phosphide, or gallium indium phosphide, or other semiconductor materials. In addition, the substrate 100 may be a semiconductor on insulator such as silicon on insulator (SOI) or silicon on sapphire. Alternatively or additionally, the substrate 100 includes other elementary semiconductor materials such as germanium, gallium arsenic, or other suitable semiconductor materials. In some embodiments, the substrate 100 further includes other features such as various doped regions, a buried layer, and/or an epitaxy layer. For instances, the substrate 100 may include various doped regions depending on design requirements (e.g., p-type wells or n-type wells). The doped regions are doped with p-type dopants, such as boron or $BF_2$, and/or n-type dopants, such as phosphorus or arsenic. Moreover, the doped regions may be formed directly on the substrate 100, in a P-well structure, in an N-well structure, in a dual-well structure, or using a raised structure.

In some embodiments, the substrate 100 also includes isolation regions 400, which are formed to isolate the first intermediate MOS device A and the second intermediate MOS device B. The isolation regions 400 utilize isolation technology, such as local oxidation of silicon (LOCOS) or shallow trench isolation (STI) to electrically isolate various regions. If the isolation regions are made of STIs, the STI region comprises silicon oxide, silicon nitride, silicon oxynitride, other suitable materials, or a combination thereof. In some examples, the filled trench has a multi-layer structure such as a thermal oxide liner layer filled with silicon nitride or silicon oxide.

The first intermediate MOS device A includes a first intermediate gate structure 200 and a pair of first source/drain 210, 220. The first intermediate gate structure 200 includes a first gate dielectric layer 202, a first intermediate gate electrode 204, and a pair of first spacers 206. The first gate dielectric layer 202 and the first intermediate gate electrode 204 are formed over the substrate 100 in sequential order from bottom to top in the first region R1. The first gate dielectric layer 202 includes silicon oxide, silicon nitride, silicon oxy-nitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the first gate dielectric layer 202 is a high-k dielectric layer with a thickness in the range of about 10 to 30 angstroms. The first gate dielectric layer 202 is formed using a suitable process such as atomic layer deposition (ALD), chemical vapor deposition (CVD), physical vapor deposition (PVD), flowable chemical vapor deposition (FCVD), thermal oxidation, UV-ozone oxidation, or a combination thereof. In some embodiments, the first intermediate gate electrode 204 includes semiconductor material. For example, the first intermediate gate electrode 204 may be made of undoped or doped polysilicon.

The first spacers 206 are formed over sidewalls of the first intermediate gate electrode 204. The first spacers 206 are formed of silicon oxide, silicon nitride, silicon oxynitride, silicon carbide, fluoride-doped silicate glass (FSG), low-k dielectric materials, or a combination thereof. It should be noted that the low-k dielectric materials are generally dielectric materials having a dielectric constant lower than 3.9. The first spacers 206 may have a multi-layer structure which includes one or more liner layers. The liner layer includes a dielectric material such as silicon oxide, silicon nitride, and/or other suitable materials. The formation of the first spacers 206 can be achieved by depositing suitable dielectric material and anisotropically etching off the dielectric material.

The first source/drain 210, 220 are formed on opposite sides of the first gate dielectric layer 202 and the first intermediate gate electrode 204. In some embodiments, the pair of the first source/drain 210, 220 may be formed by a doping process, an epitaxy growth process, or a combination thereof. In some embodiments, the first source/drain 210, 220 are formed by doping the substrate 100 with a p-type dopants or an n-type dopants. For example, the first source/drain 210, 220 of the first intermediate MOS device A may include p-type dopants. Based on the dopant type, the first intermediate MOS device A may be referred to as a PMOS device. In some embodiments, dopants are doped into the first source/drain 210, 220 through ion implantation. Alternatively, in some embodiments, part of the substrate 100 is removed through etching or other suitable processes and the dopants are formed in the hollowed area through epitaxy growth. In some embodiments, the epitaxial layers include SiGe, SiC, or other suitable materials. In some embodiments, the doping process and the epitaxy growth process may be performed in an in-situ manner to form the first source/drain 210, 220.

In some embodiments, the first intermediate MOS transistor A and the second intermediate MOS transistor B are similar. The second intermediate MOS device B includes a second intermediate gate structure 300 and a pair of first source/drain 310, 320. The second intermediate gate structure 300 includes a second gate dielectric layer 302, a second intermediate gate electrode 304, and a pair of second spacers 306. The second gate dielectric layer 302 and the second intermediate gate electrode 304 are formed over the substrate 100 in sequential order from bottom to top in the second region R2. The second spacers 306 are formed over sidewalls of the second intermediate gate electrode 304. The second source/drain 310, 320 are formed on opposite sides of the second gate dielectric layer 302 and the second intermediate gate electrode 304. In some embodiments, the first intermediate gate structure 200 and the second intermediate gate structure 300 are similar or identical. In some alternative embodiments, the elements in the second intermediate gate structure 300 are different from the elements in the first intermediate gate structure 200. It should be noted that the details described above with respect to the elements of the first intermediate gate structure 200 may also apply to the elements of the second intermediate gate structure 300, so the description of the elements in the second intermediate gate structure 300 are omitted herein.

In some embodiments, the dopant types in the first source/drain 210, 220 and the second source/drain 310, 320 are different. For example, the second source/drain 310, 320 of the second intermediate MOS device B may include n-type dopant. Based on the dopant types, the second intermediate MOS device B may be referred to as an NMOS device. In other words, the first intermediate MOS device A and the second intermediate MOS device B are of different conductive types. In some alternative embodiments, the types of the dopants are interchanged to render opposite conductive type MOS devices.

Figure 1B:
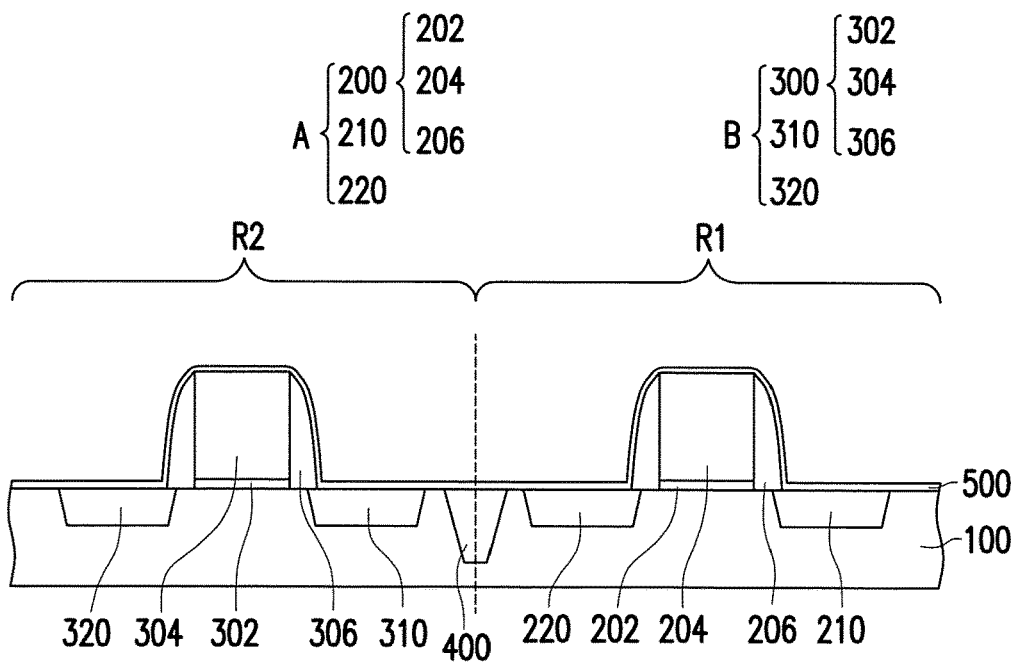

Referring to FIG. 1B, an etch stop layer 500 is formed over the first intermediate MOS device A and the second intermediate MOS device B. In some embodiments, the etch stop layer 500 is a contact etch stop layer (CESL). The etch stop layer 500 includes silicon nitride, carbon-doped silicon nitride, or a combination thereof. In some embodiments, the etch stop layer 500 is deposited using CVD, high density plasma (HDP) CVD, sub-atmospheric CVD (SACVD), molecular layer deposition (MLD), or other suitable methods. In some embodiments, before the etch stop layer 500 is formed, a buffer layer (not shown) may be further formed over the substrate 100. The buffer layer may include an oxide such as silicon oxide. In some embodiments, the buffer layer is deposited using CVD, HDPCVD, SACVD, MLD, or other suitable methods.

Figure 1C:
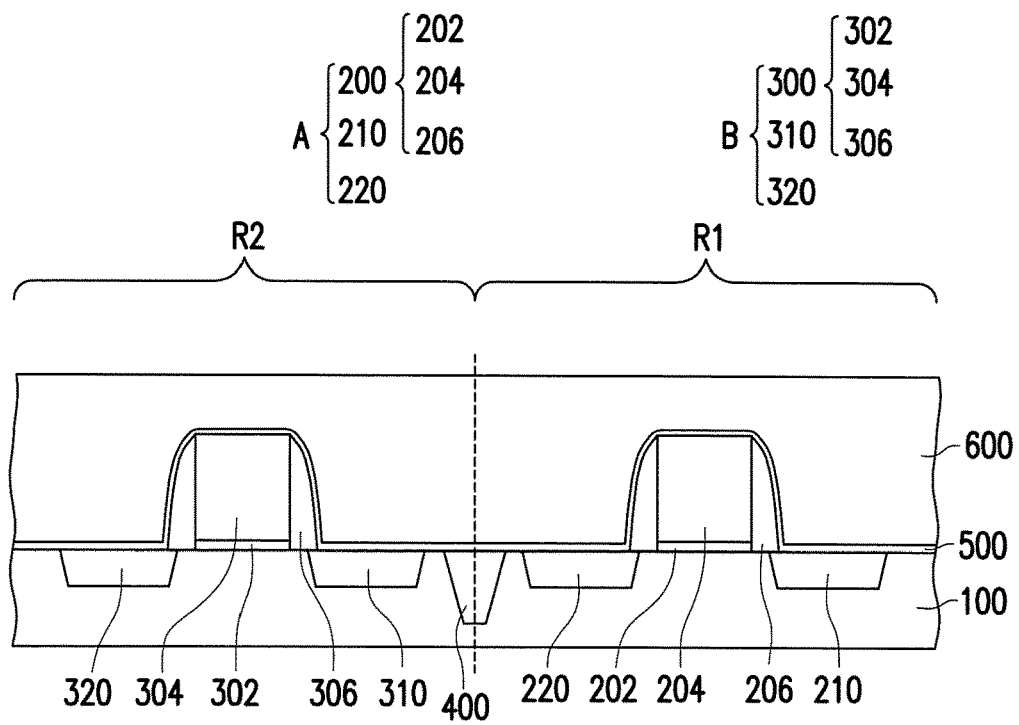

Referring to FIG. 1C, a dielectric layer 600 is formed over the etch stop layer 500 and aside the first intermediate gate structure 200 and the second intermediate gate structure 300. The dielectric layer 600 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the dielectric layer 600 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 600 may include one or more dielectric materials and/or one or more dielectric layers. In some embodiments, the dielectric layer 600 is formed to a suitable thickness by Flowable CVD (FCVD), CVD, HDP-CVD, SACVD, spin-on, sputtering, or other suitable methods.

Figure 1D:
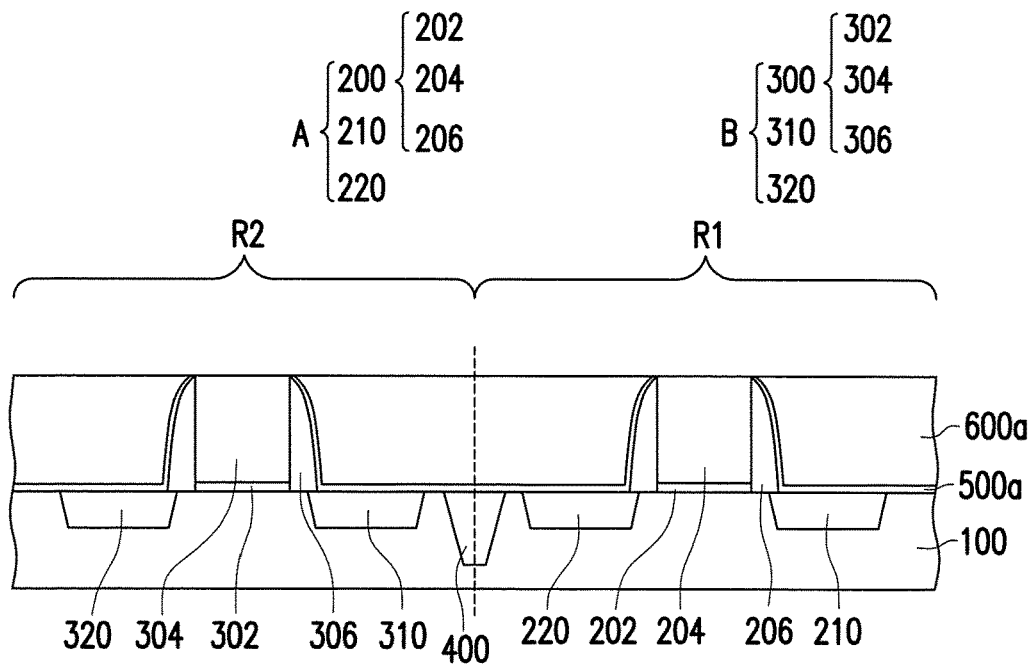

Referring to FIG. 1D, a portion of the dielectric layer 600 and a portion of the etch stop layer 500 are removed such that a top surface of the first intermediate gate electrode 204 and a top surface of the second intermediate gate electrode 304 are exposed. The process of removing the portion of the dielectric layer 600 and the portion of the etch stop layer 500 is achieved by a chemical mechanical polishing (CMP) process, an etching process, or other suitable process. As illustrated in FIG. 1D, after the removing process, the etch stop layer 500 located right on the first intermediate gate electrode 204 is removed, and the first spacers 206 and the etch stop layer 500a are located between the dielectric layer 600a and the first intermediate gate electrode 204. Similarly, the etch stop layer 500 located right on the second intermediate gate electrode 304 is removed, and the second spacers 306 and the etch stop layer 500a are located between the dielectric layer 600a and the second intermediate gate electrode 304.

Figure 1E:
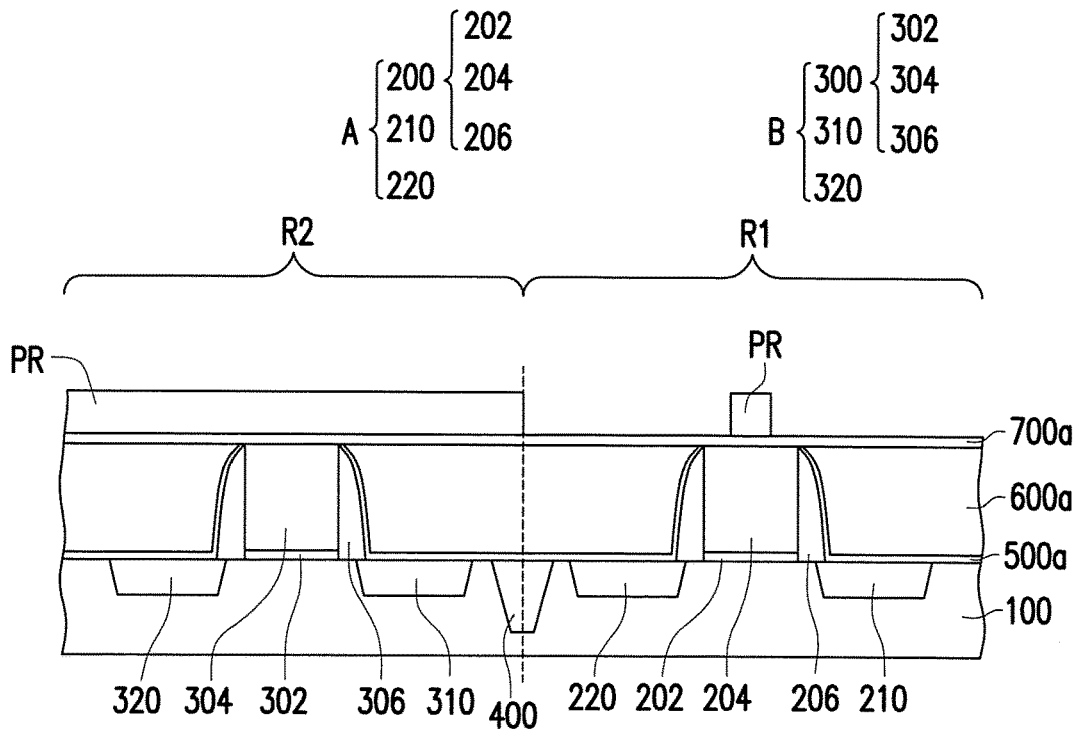

Referring to FIG. 1E, a hard mask layer 700a and a photoresist pattern PR are sequentially formed on the first intermediate gate electrode 204, the second intermediate gate electrode 304, the etch stop layer 500a, and the dielectric layer 600a. The photoresist pattern PR completely covers the hard mask layer 700a located in the second region R2. On the other hand, the photoresist pattern PR covers a portion of the hard mask layer 700a above the first intermediate gate electrode 204 located in the first region R1. In some embodiments, the photoresist pattern PR located in the first region R1 is located above a central portion the first intermediate gate electrode 204. In some embodiments, a material of the hard mask layer 700a includes TiN.

Figure 1F:
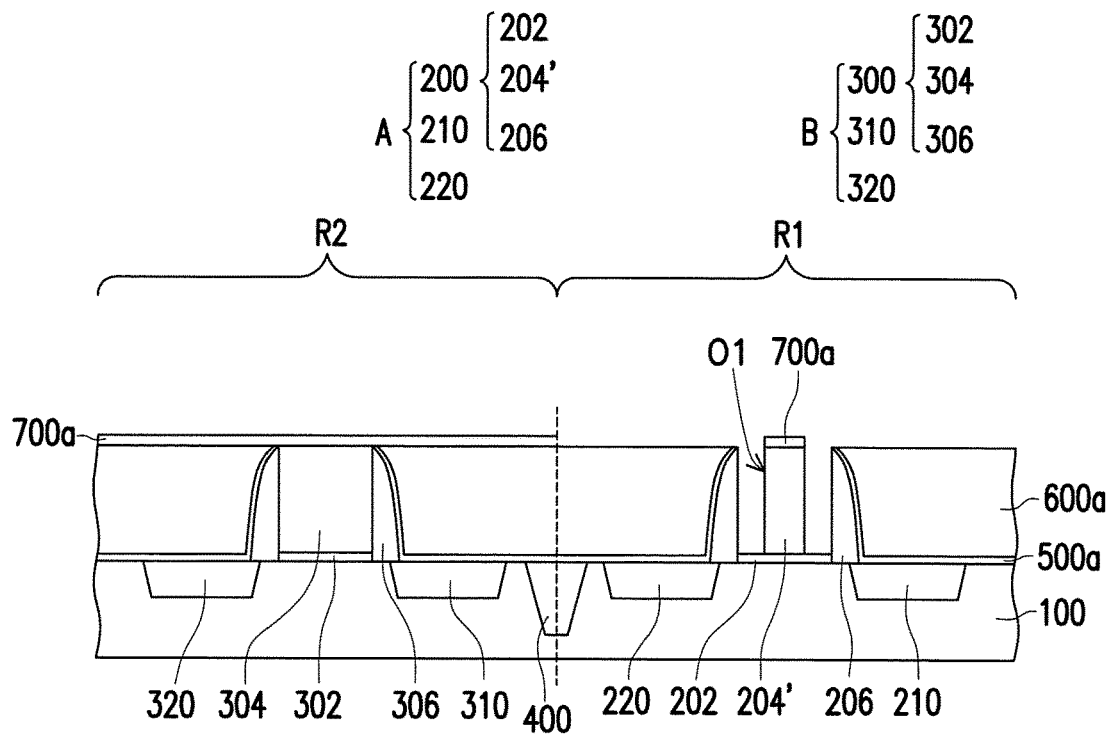

Referring to FIG. 1F, the hard mask layer 700a is patterned, and a portion of the first intermediate gate electrode 204 is removed to obtain a plurality of first openings O1 and a first semiconductor feature 204' next to the first openings O1. In some embodiments, the hard mask layer 700a is patterned by etching using the photoresist pattern PR as the mask. Later on, the photoresist pattern PR is removed. The patterned hard mask layer 700a completely covers the second intermediate MOS device B located in the second region R2 while exposing at least a portion (for example, a peripheral portion) of the first intermediate gate electrode 204 located in the first region R1. Thereafter, the portion of the first intermediate gate electrode 204 exposed by the patterned hard mask layer 700a is removed through a selective etching process. A dry stripping process, a wet stripping process, or other suitable selective etching processes may be performed to selectively remove the exposed portion of the first intermediate gate electrode 204. In some embodiments, the central portion of the first intermediate gate electrode 204 is remained to form the first semiconductor feature 204'. On the other hand, the first intermediate gate electrode 204 located between the central portion and the first spacers 206 (i.e. the peripheral portion of the first intermediate gate electrode 204) is removed to form the first openings O1. In some embodiments, using the first intermediate gate electrode 204 made of polysilicon as an example, the selective etching process having high selectivity toward polysilicon is performed to selectively etching off the polysilicon, rather than removing other materials or other elements such as spacers 206 or the dielectric layer 600a. However, the disclosure is not limited thereto. In some alternative embodiments, the configuration of the first openings O1 and the first semiconductor feature 204' may be different from the illustration of FIG. 1F, and the detailed description thereof will be discussed in later embodiments.

Figure 1G:
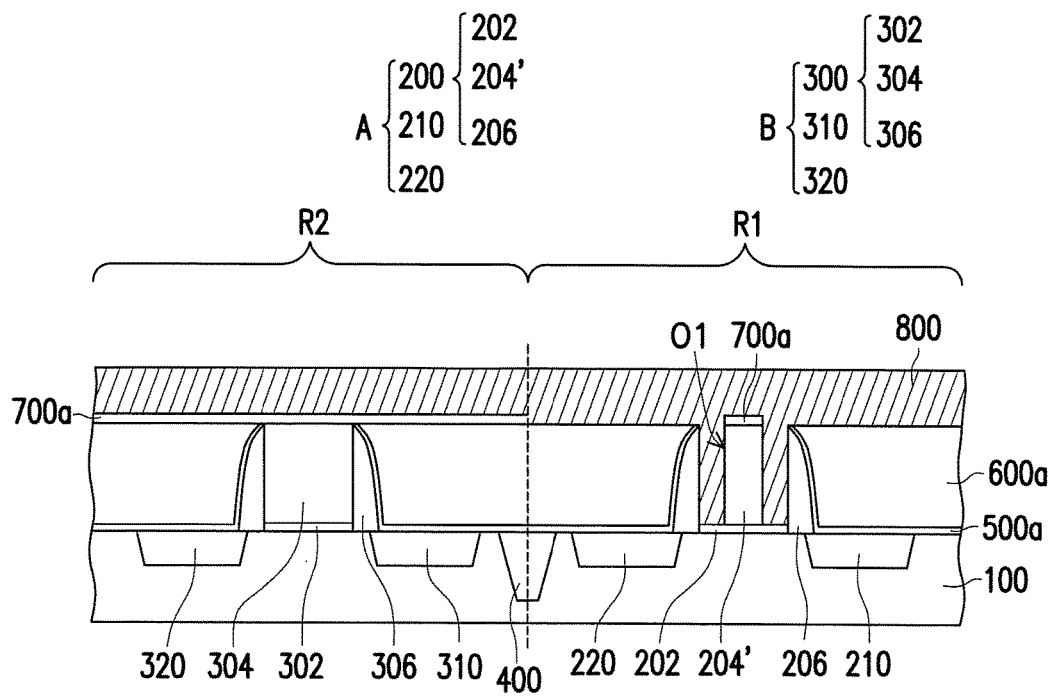

Referring to FIG. 1G, a first metal material 800 is formed over the hard mask layer 700a and is filled into the first openings OP1. In some embodiments, the first intermediate MOS device A may be a PMOS device and the first metal material 800 may include TiN, WN, TaN, or Ru.

Figure 1H:
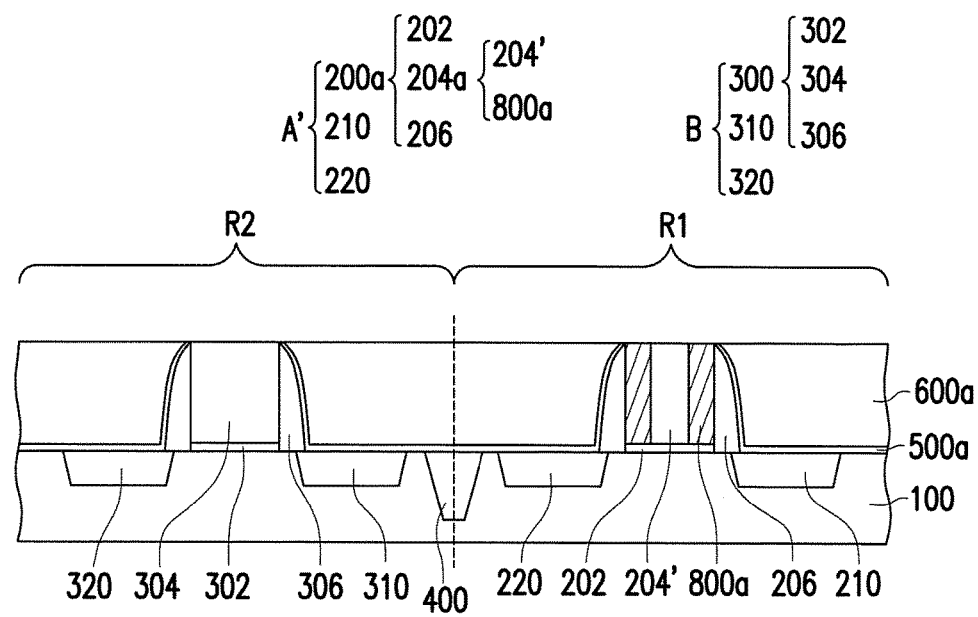

Referring to FIG. 1H, the excessive first metal material 800 and the hard mask layer 700a may be removed to form a first metal feature 800a. The removing process may be achieved by a chemical mechanical polishing (CMP) process, for example. Referring to FIG. 1F to FIG. 1H, part of the first intermediate gate electrode 204 is replaced by the first metal feature 800a to form a first MOS device A'. The first MOS device A' includes a first composite gate structure 200a formed over the substrate 100 and a pair of first source/drain 210, 220 formed on opposite sides of the first composite gate structure 200a. The first composite gate structures 200a includes the first gate dielectric layer 202, the first composite gate electrode 204a, and the first spacers 206. In some embodiments, the first composite gate electrode 204a includes the first metal feature 800a and the first semiconductor feature 204' stacked on the first gate dielectric layer 202 side by side. Referring to the top view of FIG. 2, the first metal feature 800a includes two metal strips, the first semiconductor feature 204' includes a semiconductor strip, and the semiconductor strip (the first semiconductor feature 204') is sandwiched between the two metal strips (the first metal feature 800a), thus constituting the strip-shaped first composite gate electrode 204a. It should be noted that the number of the metal strips and the semiconductor strip is not limited thereto. In some alternative embodiments, the number of the metal strips and/or the semiconductor strip may be more or less base on demand. Moreover, the first composite gate electrode 204a may further include a barrier layer, a work function layer, or a combination thereof. It should be noted that a liner layer, an interfacial layer, a seed layer, an adhesion layer, or a combination thereof may be further included between the first composite gate electrode 204a and the substrate 100 or the first gate dielectric layer 202.

Figure 1I:
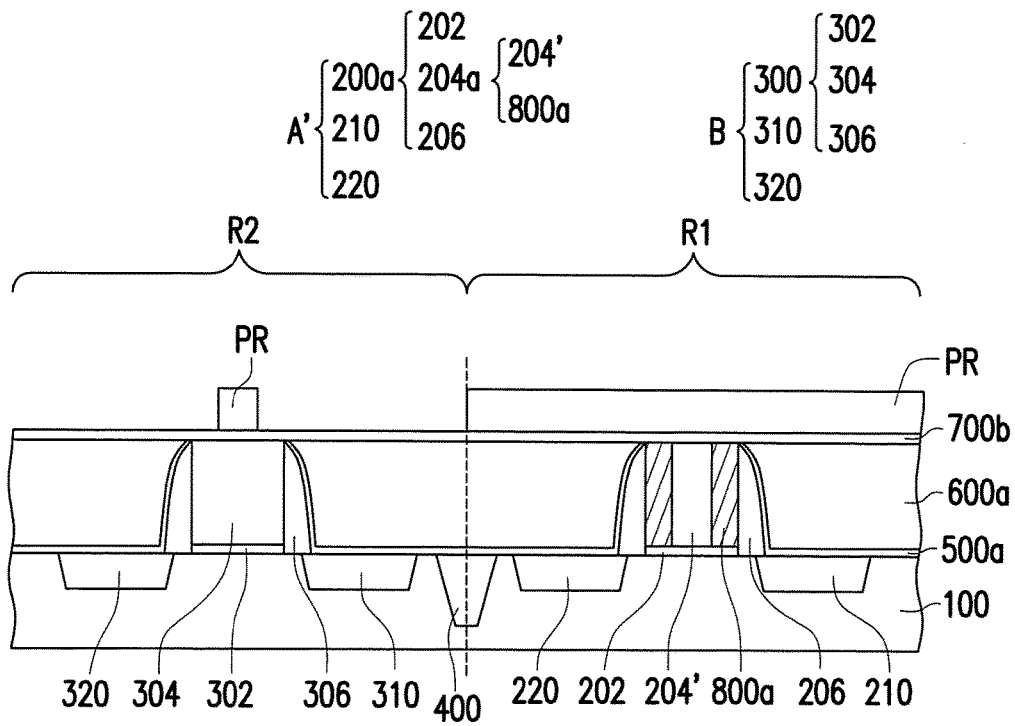

Referring to FIG. 1I, a hard mask layer 700b and a photoresist pattern PR are sequentially formed on the first composite gate electrode 204a, the second intermediate gate electrode 304, the etch stop layer 500a, and the dielectric layer 600a. The photoresist pattern PR completely covers the hard mask layer 700b located in the first region R1. On the other hand, the photoresist pattern PR covers a portion of the hard mask layer 700b above the second intermediate gate electrode 304 located in the second region R2. In some embodiments, the photoresist pattern PR located in the second region R2 is located above a central portion the second intermediate gate electrode 304. In some embodiments, a material of the hard mask layer 700b is similar to the material of the hard mask layer 700a and includes TiN. In some alternative embodiments, the hard mask layer 700b may be a bottom anti-reflective coating (BARC). The anti-reflection layer is a nitrogen-free anti-reflective coating (NFARC) layer. The NFARC layer includes materials containing, for example, carbon and oxygen.

Figure 1J:
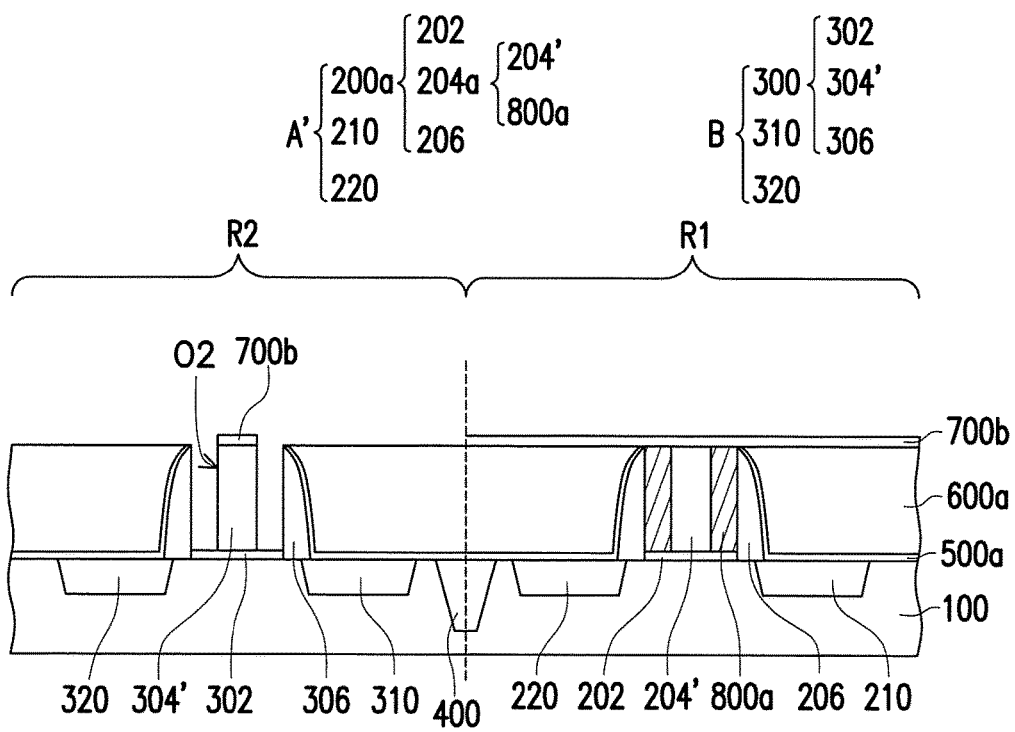

Referring to FIG. 1J, the hard mask layer 700b is patterned, and a portion of the second intermediate gate electrode 304 is removed to obtain a plurality of second openings O2 and a second semiconductor feature 304' next to the second openings O2. In some embodiments, the hard mask layer 700b is patterned by etching using the photoresist pattern PR as the mask. Later on, the photoresist pattern PR is removed. The second intermediate gate electrode 304 may be partially removed through steps similar to that of the first intermediate gate electrode 204, so the detailed description is omitted herein. In some embodiments, the central portion of the second intermediate gate electrode 304 is remained to form the second semiconductor feature 304'. On the other hand, the second intermediate gate electrode 304 located between the central portion and the second spacers 306 (i.e. a peripheral portion of the second intermediate gate electrode 304) is removed to form the second openings O2. However, the disclosure is not limited thereto. In some alternative embodiments, the configuration of the second openings O2 and the second semiconductor feature 304' may be different from the illustration of FIG. 1J, and the detailed description thereof will be discussed in later embodiments.

Figure 1K:
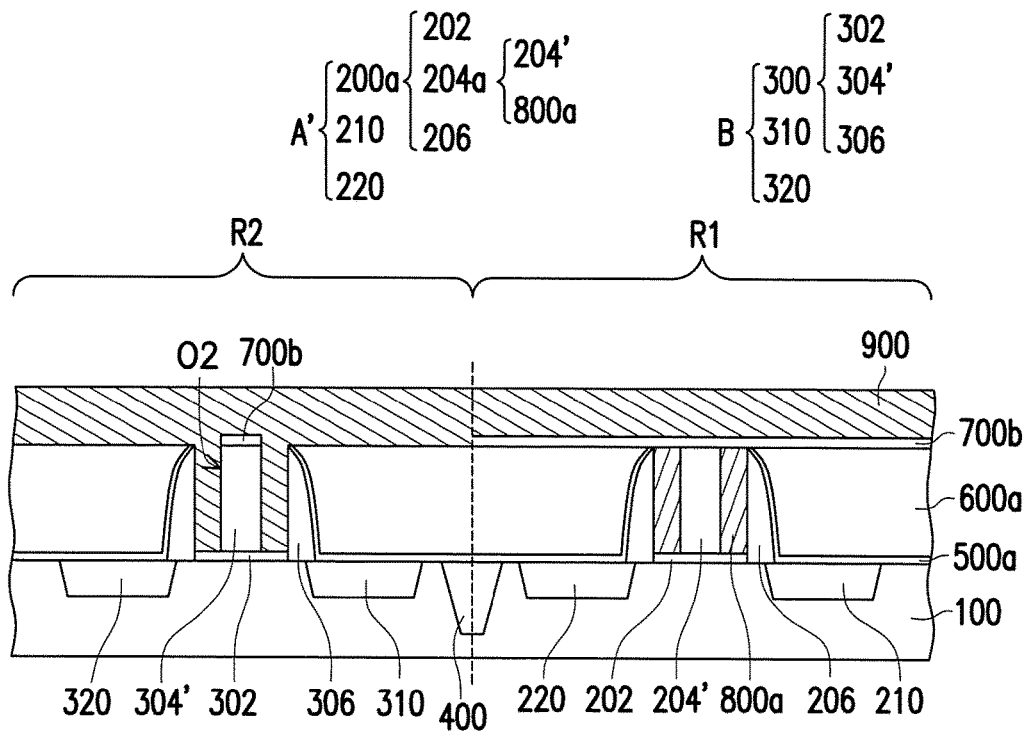

Referring to FIG. 1K, a second metal material 900 is formed over the hard mask layer 700b and is filled into the second openings OP2. In some embodiments, the second intermediate MOS device B may be an NMOS device and the second metal material 900 may include Ti, Ag, Al, TiAl, TiAlN, TaC, TaCN, TaSiN, Mn, or Zr.

Figure 1L:
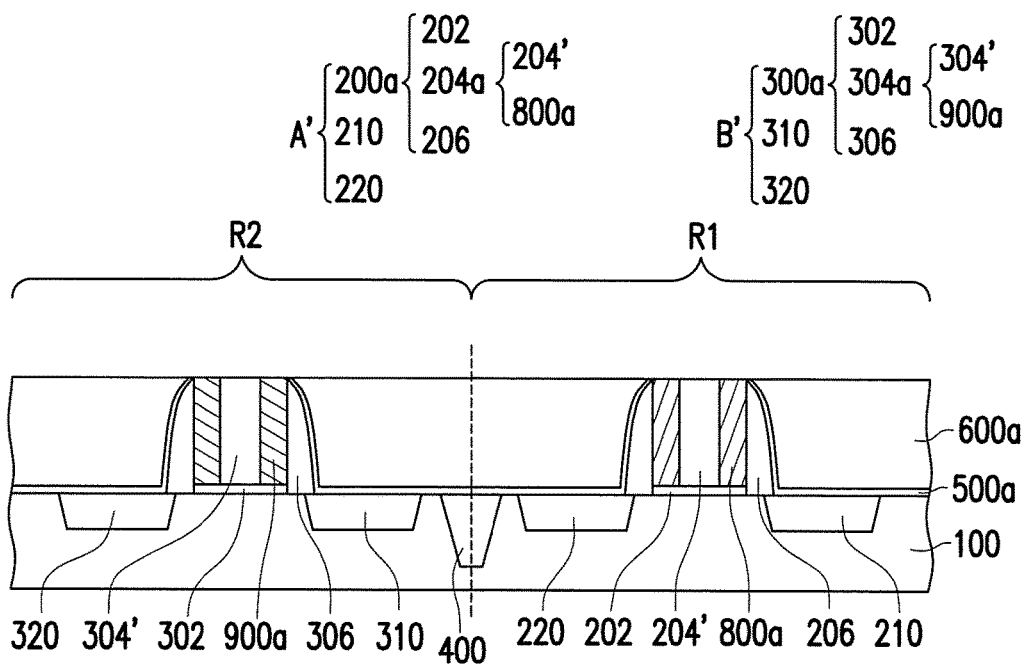

Referring to FIG. 1L, the excessive second metal material 900 and the hard mask layer 700b may be removed to form a second metal feature 900a. The removing process may be achieved by a chemical mechanical polishing (CMP) process, for example. Referring to FIG. 1J to FIG. 1L, part of the second intermediate gate electrode 304 is replaced by the second metal features 900a to form a second MOS device B'. The second MOS device B' includes a second composite gate structure 300a formed over the substrate 100 and a pair of second source/drain 310, 320 formed on opposite sides of the second composite gate structure 300a. The second composite gate structures 300a includes the second gate dielectric layer 302, the second composite gate electrode 304a, and the second spacers 306. In some embodiments, the second composite gate electrode 304a includes the second metal feature 900a and the second semiconductor feature 304' stacked on the second gate dielectric layer 302 side by side. Similar to that of the first composite gate electrode 204a, the second metal feature 900a of the second composite gate electrode 304a are two metal strips and the second semiconductor feature 304' of the second composite gate electrode 304a is a semiconductor strip. The semiconductor strip (the second semiconductor feature 304') is sandwiched between the two metal strips (the second metal feature 900a), thus constituting the strip-shaped second composite gate electrode 304a. It should be noted that the number of the metal strips and the semiconductor strip is not limited thereto. In some alternative embodiments, the number of the metal strips and/or the semiconductor strip may be more or less base on demand. Moreover, the second composite gate electrode 304a may further include a barrier layer, a work function layer, or a combination thereof. It should be noted that a liner layer, an interfacial layer, a seed layer, an adhesion layer, or a combination thereof may be further included between the second composite gate electrode 304a and the substrate 100 or the second gate dielectric layer 302.

Figure 1M:
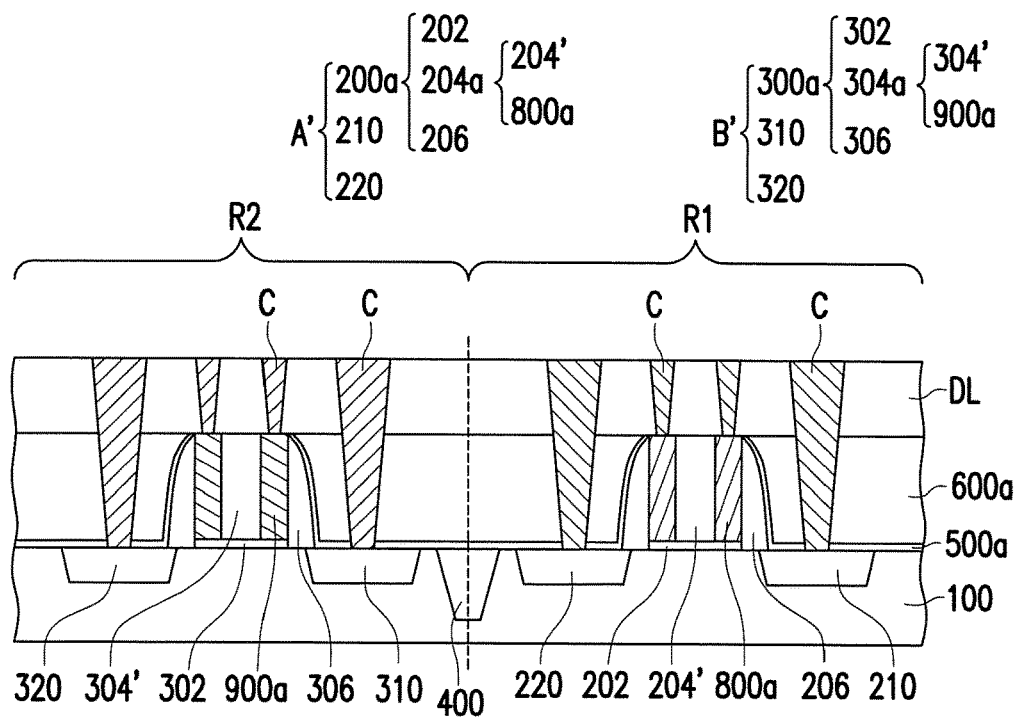

Referring to FIG. 1M, an inter-layer dielectric layer DL is formed on the first MOS device A' and the second MOS device B'. A material and a formation method of the inter-layer dielectric layer DL are similar to that of the dielectric layer 600, so the detailed description thereof is omitted herein. It is understood that the inter-layer dielectric layer DL may include one or more dielectric materials and/or one or more dielectric layers. After the inter-layer dielectric layer DL is formed, a plurality of contact structures C penetrating through the inter-layer dielectric layer DL, the dielectric layer 600a, and the etch stop layer 500a is formed to obtain a semiconductor device 10. In some embodiments, the contact structures C are formed to be electrically connected with the first metal feature 800a, the second metal feature 900a, the first source/drain 210, 220, and the second source/drain 310, 320. In some embodiments, a resistive protective oxide (RPO) layer may be formed on the first semiconductor feature 204' and the second semiconductor feature 304' to protect these semiconductor features. However, the disclosure is not limited thereto. In some alternative embodiments, the contact structures C may be electrically connected to the first semiconductor feature 204' and the second semiconductor feature 304' instead of the first metal feature 800a and the second metal feature 900a. In this case, a silicide layer may be formed between the contact structures C and the first semiconductor feature 204' and between the contact structures C and the second semiconductor feature 304'. The contact structures C may be formed by first forming a plurality of contact holes (not shown) through a photolithography process and an etching process. Subsequently, a conductive material may be filled into the contact holes to form the contact structures C. The conductive material may include metal material or alloy, for example. In some embodiments, the metal material includes copper, copper alloys, aluminum, aluminum alloys, tungsten, or a combination thereof. In some embodiments, the contact structures C may further include liner layers, seed layers, adhesion layers, barrier layers, etc.

In some embodiments, since the first composite gate electrode 204a and the second composite gate electrode 304a are respectively constituted by the first and second metal features 800a, 900a and the first and second semiconductor features 204', 304', the loading effect may be sufficiently reduced during the manufacturing process of the semiconductor device 10. For example, the loading effect during the CMP process may be alleviated. As a result, the circuit design may be more flexible while satisfying design rules.

Figure 3A:
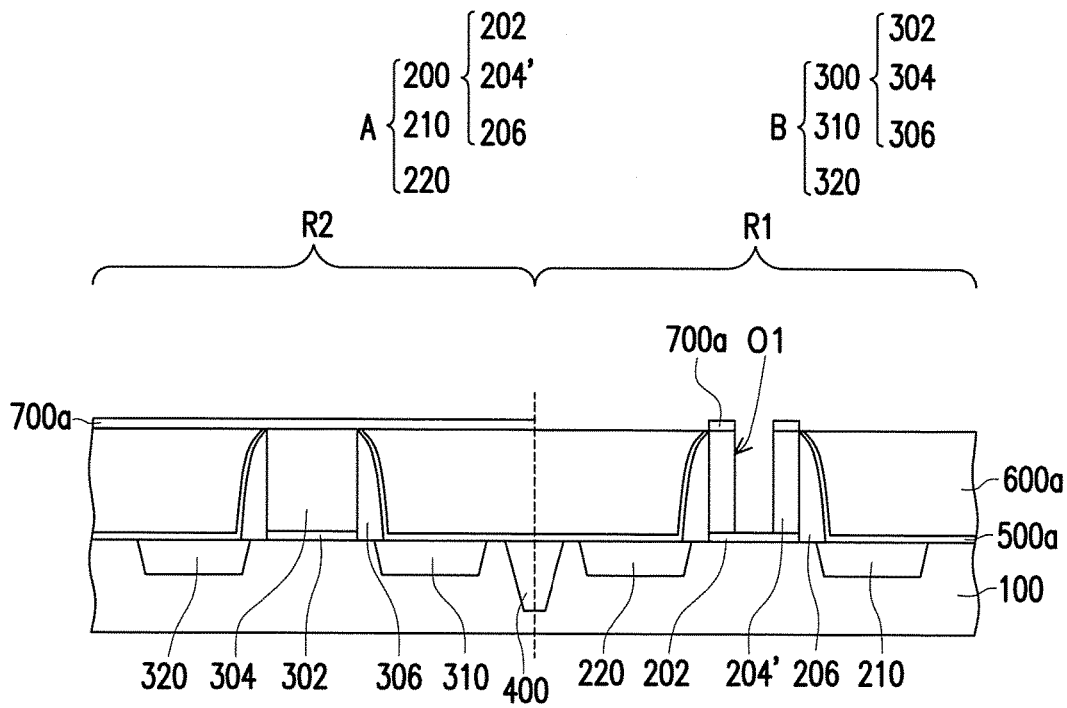
FIGS. 3A-3E are schematic cross-sectional views illustrating a process flow for manufacturing a semiconductor device in accordance with some alternative embodiments of the disclosure.
Figure 3B:
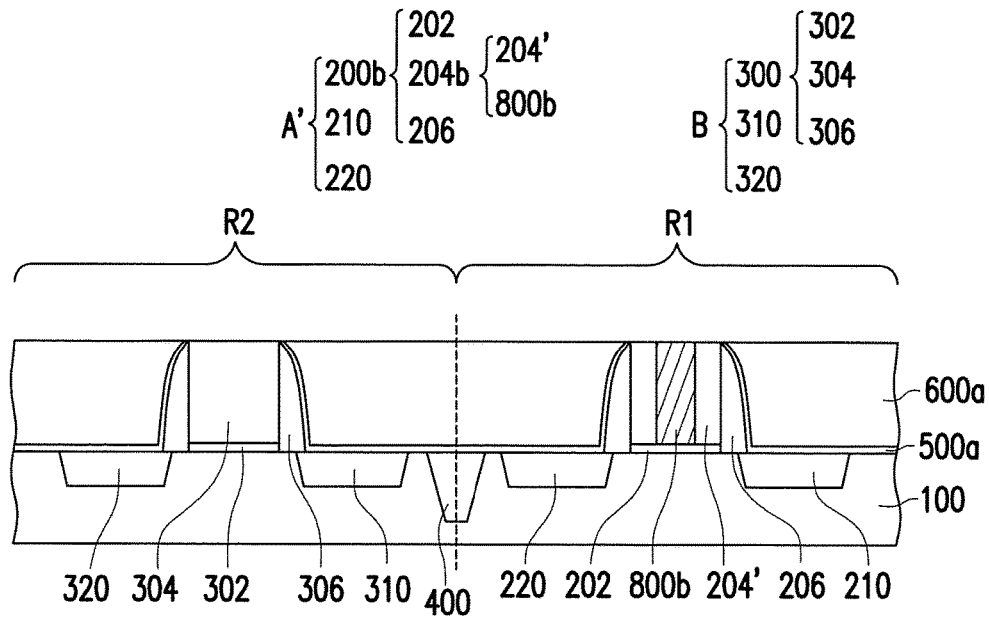

FIGS. 3A-3E are schematic cross-sectional views illustrating a process flow for manufacturing a semiconductor device 20 in accordance with some alternative embodiments of the disclosure. FIG. 4 is a schematic top view of a first composite gate electrode 204b in FIG. 3B.

In some embodiments, some steps of the manufacturing process of the semiconductor device 20 is similar to that of FIG. 1A to FIG. 1D, so the detailed description is omitted herein. After the step illustrated in FIG. 1D, referring to FIG. 3A, a hard mask layer 700a is formed over the dielectric layer 600a. Unlike the embodiment of FIG. 1F where the central portion of the first intermediate gate electrode 204 is remained and the peripheral portion of the first intermediate gate electrode 204 is removed, as illustrated in FIG. 3A, the central portion of the first intermediate gate electrode 204 is removed to render a first opening O1 and a first semiconductor feature 204' next to the first opening O1. Referring to FIG. 3B, Similar to the step of FIG. 1G, a first metal material 800 may be filled into the first opening O1 to form a first metal feature 800b. The first composite gate structure 200b includes the first gate dielectric layer 202, the first composite gate electrode 204b formed on the first gate dielectric layer 202, and the first spacers 206 formed on sidewalls of the first composite gate electrode 204b. Referring to the top view of FIG. 4, the first composite gate electrode 204b includes the first metal feature 800b and the first semiconductor feature 204'. In some embodiments, the first metal feature 800b includes a metal strip, the first semiconductor feature 204' includes two semiconductor strips, and the metal strip (the first metal feature 800b) is sandwiched between the two semiconductor strips (the first semiconductor features 204'), thus constituting the strip-shaped first composite gate electrode 204b. It should be noted that the number of the metal strips and the semiconductor strip is not limited thereto. In some alternative embodiments, the number of the metal strips and/or the semiconductor strip may be more or less base on demand.

Figure 3C:
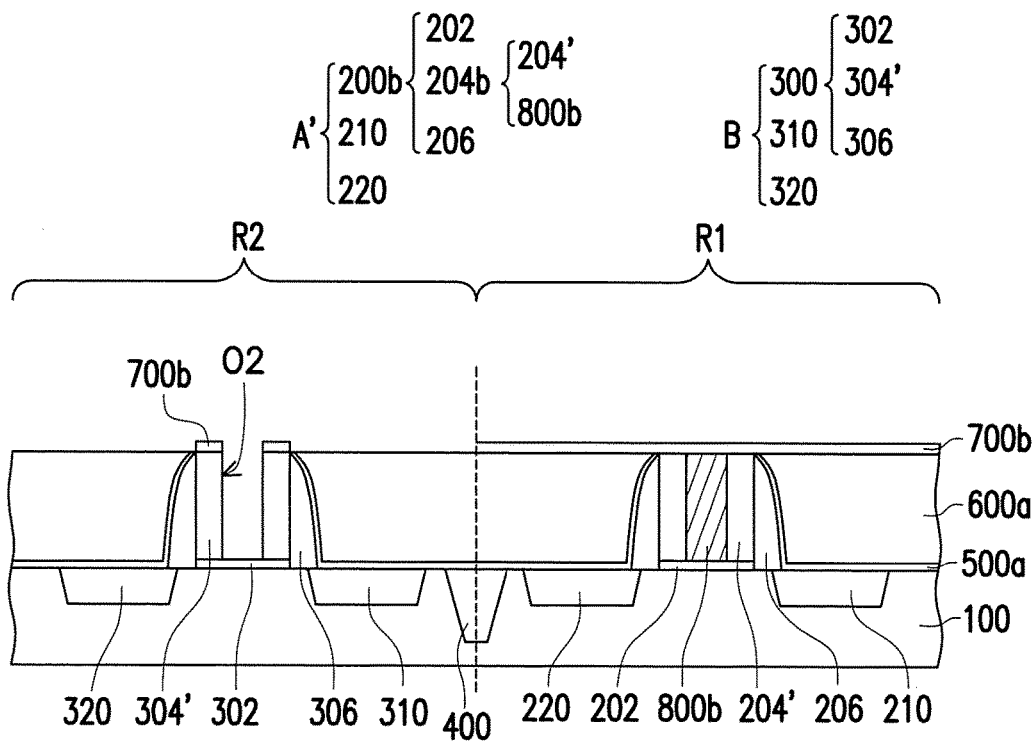
Figure 3D:
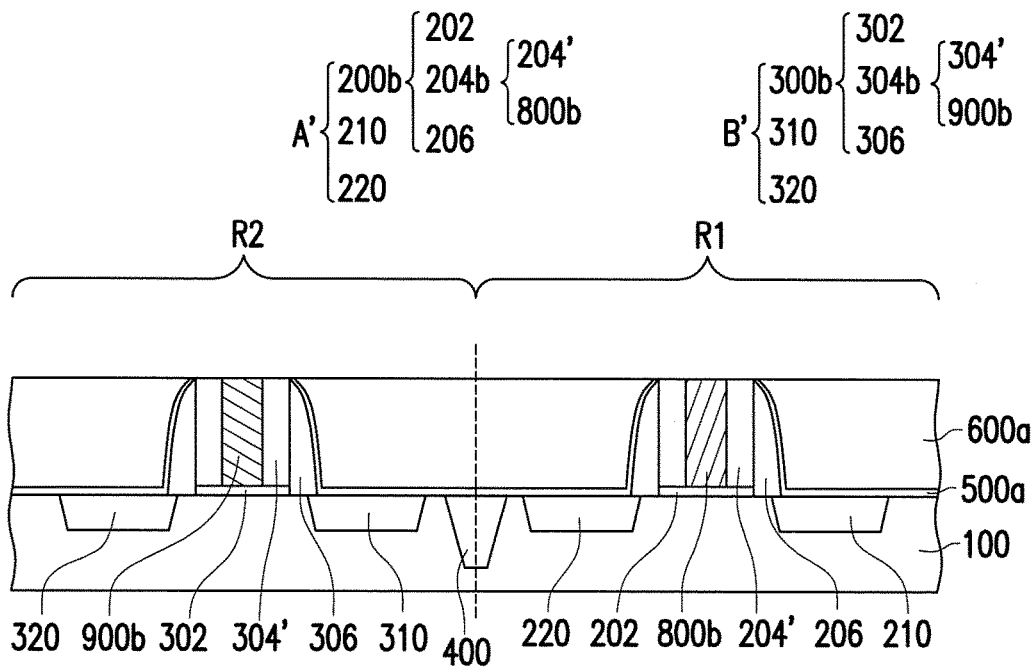
Figure 4:
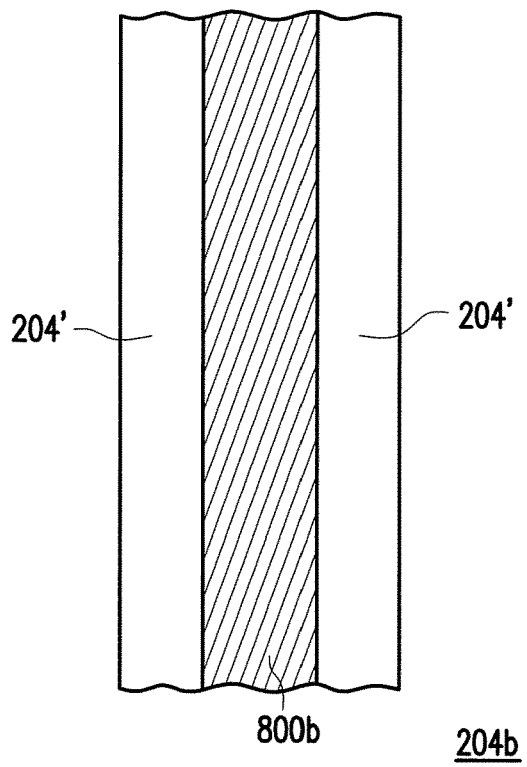
FIG. 4 is a schematic top view of a first composite gate electrode in FIG. 3B.

Referring to FIG. 3C, a hard mask layer 700b is formed over the dielectric layer 600a. Unlike the embodiment of FIG. 1J where the central portion of the second intermediate gate electrode 304 is remained and the peripheral portion of the second intermediate gate electrode 304 is removed, as illustrated in FIG. 3C, the central portion of the second intermediate gate electrode 304 is removed to render a second opening O2 and a second semiconductor feature 304'. Referring to FIG. 3D, Similar to the step of FIG. 1K, a second metal material 900 may be filled into the second opening O2 to form a second metal feature 900b. The second composite gate structure 300b includes the second gate dielectric layer 302, the second composite gate electrode 304b formed on the second gate dielectric layer 302, and the second spacers 306 formed on sidewalls of the second composite gate electrode 304b. Similar to the first composite gate electrode 204b, in the second composite gate electrode 304b, the second metal feature 900b includes a metal strip, the second semiconductor feature 304' includes two semiconductor strips, and the metal strip (the second metal feature 900b) is sandwiched between the two semiconductor strips (the second semiconductor features 304'), thus constituting the strip-shaped second composite gate electrode 304b. It should be noted that the number of the metal strips and the semiconductor strip is not limited thereto. In some alternative embodiments, the number of the metal strips and/or the semiconductor strip may be more or less base on demand.

Figure 3E:
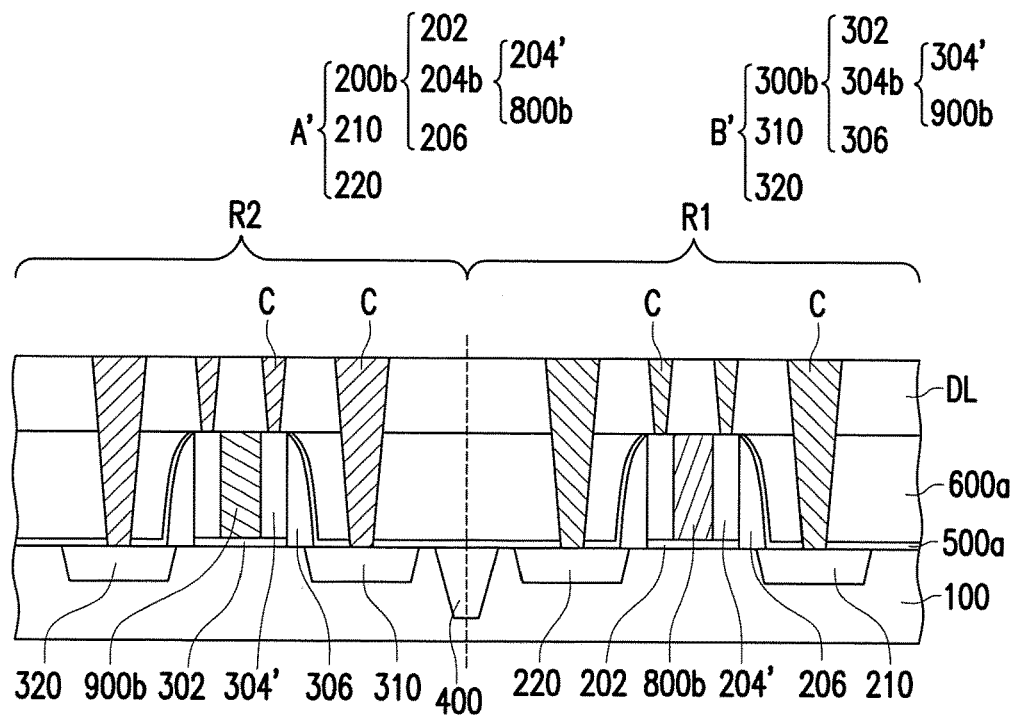

Referring to FIG. 3E, similar to the embodiment of FIG. 1M, and inter-layer dielectric layer DL and a plurality of contact structures C are formed over the first MOS device A' and the second MOS device B'. However, unlike the embodiment of FIG. 1M where the contact structures C are connected to the metal features and the source/drain, in some embodiments as illustrated in FIG. 3E, the contact structures C may be formed to connect with the first semiconductor feature 204', the first source/drain 210, 220, the second semiconductor feature 304', and the second source/drain 310, 330. In some embodiments, a silicide layer may be formed between the contact structures C and the first semiconductor feature 204' and between the contact structures C and the second semiconductor feature 304'.

Figure 5A:
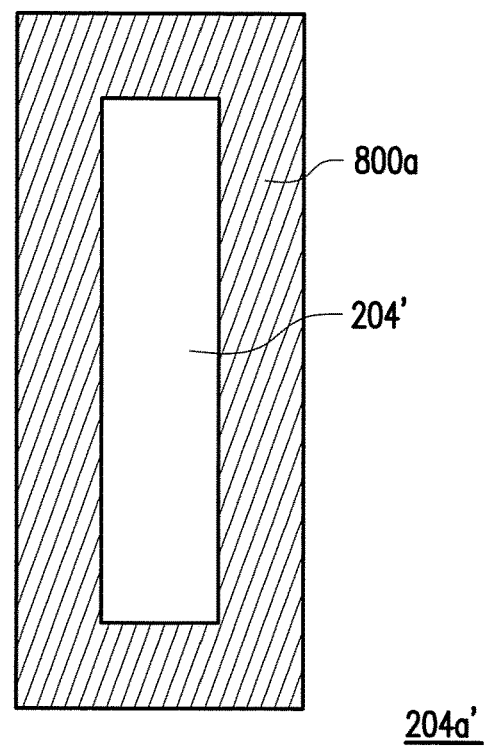
FIG. 5A is a schematic top view of a first composite gate electrode according to some alternative embodiments of the disclosure.

FIG. 5A is a schematic top view of a first composite gate electrode 204a' according to some alternative embodiments of the disclosure. In the embodiment of FIG. 2, the peripheral portion of the first intermediate gate electrode 204 is constituted by the strip-shaped regions next to a central portion/region of the first intermediate gate electrode 204. On the other hand, referring to FIG. 5A, in some embodiments, the peripheral portion of the first intermediate gate electrode 204 is constituted by a ring-shaped region surrounding the central portion/region of the first intermediate gate electrode 204. As a result, the first metal feature 800a of the first composite gate electrode 204a' is formed to be a ring shape and surrounds the first semiconductor feature 204' of the first composite gate electrode 204a'.

Figure 5B:
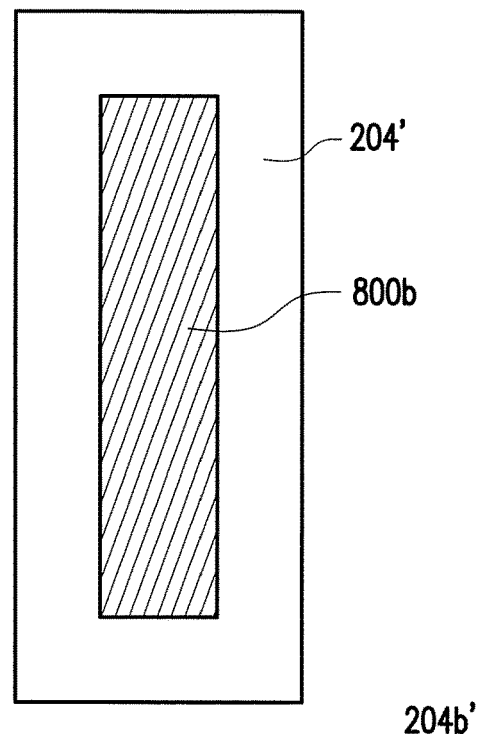
FIG. 5B is a schematic top view of a first composite gate electrode according to some alternative embodiments of the disclosure.

FIG. 5B is a schematic top view of a first composite gate electrode 204b' according to some alternative embodiments of the disclosure. In the embodiment of FIG. 4, the central portion of the first intermediate gate electrode 204 is constituted by the strip-shaped region in the middle of the first intermediate gate electrode 204. On the other hand, referring to FIG. 5B, in some embodiments, the central portion of the first intermediate gate electrode is enclosed by the peripheral portion/region of the first intermediate gate electrode 204. As a result, the first metal feature 800a of the first composite gate electrode 204b' is formed such that the first semiconductor feature 204' exhibits a ring-shape and surrounds the first metal feature 800b.

Figure 6:
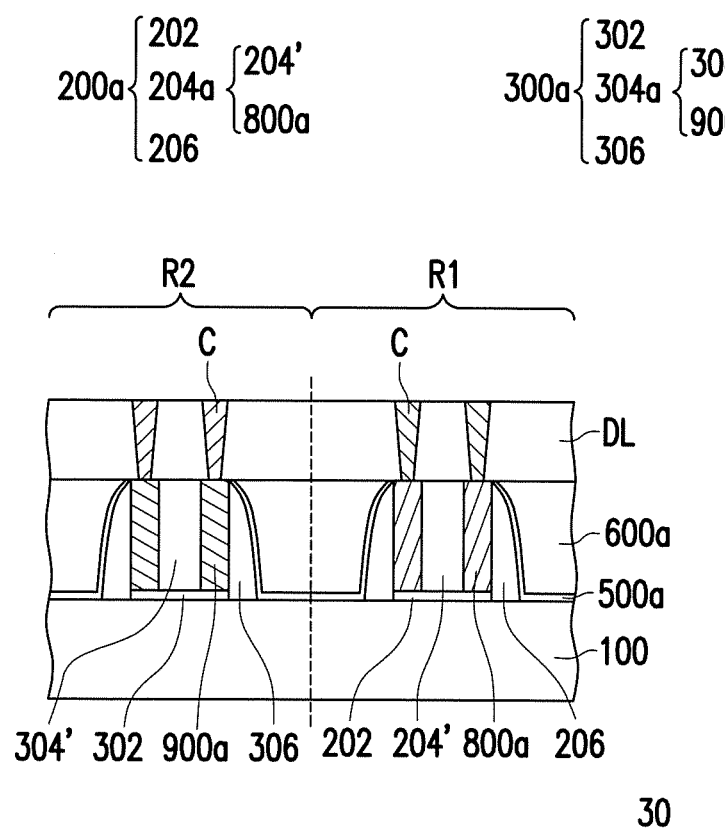
FIG. 6 is a schematic cross-sectional view of a semiconductor device in accordance with some alternative embodiments of the disclosure.

It should be noted that since the first MOS device A' and the second MOS device B' illustrated in FIG. 1M and FIG. 3E respectively includes source/drain regions, these devices may be referred to as MOS transistors. However, the disclosure is not limited thereto. In some embodiments, the substrate 100 does not include source/drain regions. FIG. 6 is a schematic cross-sectional view of a semiconductor device 30 in accordance with some alternative embodiments of the disclosure. Referring to FIG. 6, the substrate 100 of the semiconductor device 30 does not include source/drain regions. Moreover, the first composite gate structure 200a and the second composite gate structure 300a may be arranged in proximity with each other. In some embodiments, the contact structures C are connected to the first metal feature 800a and the second metal feature 900a. In some alternative embodiments, the contact structures C are connected to the first semiconductor feature 204' and the second semiconductor feature 304'. In some embodiments, the structure illustrated in FIG. 6 may be utilized as a MOS capacitor or a MOS resistor.

In accordance with some embodiments of the disclosure, a semiconductor device includes a composite gate structure formed over a semiconductor substrate. The composite gate structure includes a gate dielectric layer, a metal feature, and a semiconductor feature. The metal feature is disposed on the gate dielectric layer. The semiconductor feature is disposed on the gate dielectric layer. The metal feature and the semiconductor feature are stacked on the gate dielectric layer side by side.

In accordance with some alternative embodiments of the disclosure, a semiconductor device includes a semiconductor substrate, a first metal-oxide-semiconductor (MOS) device, a second metal-oxide-semiconductor (MOS) device, and a dielectric layer. The substrate has a first region and a second region. The first MOS device is disposed in the first region. The first MOS device includes a first composite gate structure formed over the semiconductor substrate and a pair of first source/drain on opposite sides of the first composite gate structure. The first composite gate structure includes a first gate dielectric layer, a first metal feature, and a first semiconductor feature. The first metal feature is disposed on the first gate dielectric layer. The first semiconductor feature is disposed on the first gate dielectric layer. The first metal feature and the first semiconductor feature are stacked on the first gate dielectric layer side by side. The second MOS device is disposed in the second region. The second MOS device includes a second composite gate structure formed over the semiconductor substrate and a pair of second source/drain on opposite sides of the second composite gate structure. The second composite gate structure includes a second gate dielectric layer, a second metal feature, and a second semiconductor feature. The second metal feature is disposed on the second gate dielectric layer. The second semiconductor feature is disposed on the second gate dielectric layer. The second metal feature and the second semiconductor feature are stacked on the second gate dielectric layer side by side. The dielectric layer is formed aside the first MOS device and the second MOS device.

In accordance with some embodiments of the disclosure, a manufacturing method of a semiconductor device includes at least the following steps. First, a semiconductor substrate having a first region and a second region are provided. Thereafter, a first metal-oxide-semiconductor (MOS) device is formed in the first region. The step of forming the first MOS device includes at least the following steps. First, a first gate dielectric layer and a first intermediate gate electrode are sequentially formed on the semiconductor substrate. The first intermediate gate electrode includes semiconductor material. Next, a pair of first source/drain of a first type is formed on opposite sides of the first gate dielectric layer and the first intermediate gate electrode. Subsequently, a portion of the first intermediate gate electrode is removed to form at least one first opening and a first semiconductor feature. Thereafter, a first metal material is filled into the at least one first opening to form a first metal feature. The first metal feature, the first semiconductor feature, and the first gate dielectric layer constitute a first composite gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a composite gate structure formed over a semiconductor substrate, wherein the composite gate structure comprises:
        a gate dielectric layer;
        a metal layer disposed on the gate dielectric layer; and
        a semiconductor layer disposed on the gate dielectric layer, wherein the metal layer and the semiconductor layer are stacked on the gate dielectric layer side by side.

2. The semiconductor device according to claim 1, further comprising a dielectric layer formed aside the composite gate structure.

3. The semiconductor device according to claim 1, wherein the metal layer comprises two metal strips, the semiconductor layer comprises a semiconductor strip, and the semiconductor strip is sandwiched between the two metal strips.

4. The semiconductor device according to claim 1, wherein the metal layer comprises a metal strip, the semiconductor layer comprises two semiconductor strips, and the metal strip is sandwiched between the two semiconductor strips.

5. The semiconductor device according to claim 1, wherein a material of the semiconductor layer comprises polysilicon.

6. The semiconductor device according to claim 1, further comprising at least one contact structure connected to the metal layer of the composite gate.

7. The semiconductor device according to claim 1, further comprising at least one contact structure connected to the semiconductor layer of the composite gate.

8. A semiconductor device, comprising:
    a semiconductor substrate, having a first region and a second region;
    a first metal-oxide-semiconductor (MOS) device disposed in the first region, wherein the first MOS device comprises a first composite gate structure formed over the semiconductor substrate and a pair of first source/drain on opposite sides of the first composite gate structure, the first composite gate structure comprises:
        a first gate dielectric layer;
        a first metal layer disposed on the first gate dielectric layer; and
        a first semiconductor layer disposed on the first gate dielectric layer, wherein the first metal layer and the first semiconductor layer are stacked on the first gate dielectric layer side by side;
    a second metal-oxide-semiconductor (MOS) device disposed in the second region, wherein the second MOS device comprises a second composite gate structure formed over the semiconductor substrate and a pair of second source/drain on opposite sides of the second composite gate structure, the second composite gate structure comprises:
        a second gate dielectric layer;
        a second metal layer disposed on the second gate dielectric layer; and
        a second semiconductor layer disposed on the second gate dielectric layer, wherein the second metal layer and the second semiconductor layer are stacked on the second gate dielectric layer side by side; and
    a dielectric layer formed aside the first MOS device and the second MOS device.

9. The semiconductor device according to claim 8, wherein the first metal layer comprises two metal strips, the first semiconductor layer comprises a semiconductor strip, and the semiconductor strip is sandwiched between the two metal strips.

10. The semiconductor device according to claim 8, wherein the first metal layer comprises a metal strip, the first semiconductor layer comprises two semiconductor strips, and the metal strip is sandwiched between the two semiconductor strips.

11. The semiconductor device according to claim 8, wherein the second metal layer comprises two metal strips, the second semiconductor layer comprises a semiconductor strip, and the semiconductor strip is sandwiched between the two metal strips.

12. The semiconductor device according to claim 8, wherein the second metal layer comprises a metal strip, the second semiconductor layer comprises two semiconductor strips, and the metal strip is sandwiched between the two semiconductor strips.

13. The semiconductor device according to claim 8, further comprising a plurality of contact structures connected to the first metal layer and the second metal layer respectively.

14. The semiconductor device according to claim 8, further comprising a plurality of contact structures connected to the first semiconductor layer and the second semiconductor layer respectively.

15. A manufacturing method of a semiconductor device, comprising:
    providing a semiconductor substrate having a first region and a second region; and
    forming a first metal-oxide-semiconductor (MOS) device in the first region, comprising:
        sequentially forming a first gate dielectric layer and a first intermediate gate electrode on the semiconductor substrate, wherein the first intermediate gate electrode comprises semiconductor material;
        forming a pair of first source/drain of a first type on opposite sides of the first gate dielectric layer and the first intermediate gate electrode;
        removing a portion of the first intermediate gate electrode to form at least one first opening and a first semiconductor feature; and
        filling a first metal material into the at least one first opening to form a first metal feature, wherein the first metal feature, the first semiconductor feature, and the first gate dielectric layer constitute a first composite gate structure.

16. The method according to claim 15, further comprising:
forming a second metal-oxide-semiconductor (MOS) device in the second region, comprising:
sequentially forming a second gate dielectric layer and a second intermediate gate electrode on the semiconductor substrate, wherein the second intermediate gate electrode comprises semiconductor material;
forming a pair of second source/drain of a second type on opposite sides of the second gate dielectric layer and the second intermediate gate electrode, wherein the first type is different from the second type;
removing a portion of the second intermediate gate electrode to form at least one second opening and a second semiconductor feature; and
filling a second metal material into the at least one second opening to form a second metal feature, wherein the second metal feature, the second semiconductor feature, and the second gate dielectric layer constitute a second composite gate structure; and
forming an inter-layer dielectric layer on the first MOS device and the second MOS device.

17. The method according to claim 16, further comprising:
forming a plurality of contact structures penetrating through the inter-layer dielectric layer, wherein the plurality of contact structures are connected to the first semiconductor feature and the second semiconductor feature respectively.

18. The method according to claim 16, further comprising:
forming a plurality of contact structures penetrating through the inter-layer dielectric layer, wherein the plurality of contact structures are connected to the first metal feature and the second metal feature respectively.

19. The method according to claim 15, wherein the step of removing the portion of the first intermediate gate electrode comprises:
forming a patterned hard mask layer over the first intermediate gate electrode and the dielectric layer, wherein the patterned hard mask layer exposes at least a central portion of the first intermediate gate electrode; and
removing the central portion of the first intermediate gate electrode exposed by the patterned hard mask layer.

20. The method according to claim 15, wherein the step of removing the portion of the first intermediate gate electrode comprises:
forming a patterned hard mask layer over the first intermediate gate electrode and the dielectric layer, wherein the patterned hard mask layer exposes at least a peripheral portion next to a central portion of the first intermediate gate electrode; and
removing the peripheral portion of the first intermediate gate electrode exposed by the patterned hard mask layer.

* * * * *